United States Patent
Cho

(10) Patent No.: US 7,724,582 B2
(45) Date of Patent: *May 25, 2010

(54) DECODERS AND DECODING METHODS FOR NONVOLATILE MEMORY DEVICES USING LEVEL SHIFTING

(75) Inventor: Ji-Ho Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 35 days.

This patent is subject to a terminal disclaimer.

(21) Appl. No.: 11/933,716

(22) Filed: Nov. 1, 2007

(65) Prior Publication Data

US 2008/0106947 A1    May 8, 2008

(30) Foreign Application Priority Data

Nov. 2, 2006  (KR) .................... 10-2006-0107554

(51) Int. Cl.
*G11C 16/06*  (2006.01)
(52) U.S. Cl. ..................... 365/185.23; 365/230.06; 365/230.08
(58) Field of Classification Search ............ 365/185.23, 365/230.06, 230.08
See application file for complete search history.

(56) References Cited

U.S. PATENT DOCUMENTS

| | | |
|---|---|---|
| 5,668,758 A | 9/1997 | Yiu et al. |
| 5,880,995 A | 3/1999 | Kobatake |
| 5,991,198 A | 11/1999 | Song et al. |
| 6,088,286 A | 7/2000 | Yamauchi et al. |
| 6,166,987 A | 12/2000 | Atsumi et al. |
| 6,356,481 B1 | 3/2002 | Micheloni et al. |
| 6,542,406 B2 | 4/2003 | Byeon et al. |
| 6,611,474 B2 * | 8/2003 | Hanzawa et al. ....... 365/230.06 |
| 6,791,878 B2 | 9/2004 | Jeong |
| 6,985,399 B2 | 1/2006 | Lee |
| 7,012,836 B2 | 3/2006 | Matsubara et al. |

* cited by examiner

*Primary Examiner*—Huan Hoang
(74) *Attorney, Agent, or Firm*—Myers Bigel Sibley & Sajovec, P.A.

(57) ABSTRACT

A decoder for a nonvolatile memory device includes a level shifter configured to produce a first voltage at an output thereof responsive to a first state of a global word line and to produce a second voltage at the output responsive to a second state of the global word line. The decoder further includes a plurality of local word line drivers, each having an input coupled to the output of the level shifter, the respective local word line drivers configured to drive respective local word lines responsive to voltages on respective partial word lines when the output of the level shifter is at the first voltage and to drive the respective local word lines to a common voltage when the output of the level shifter is at the second voltage. The first state of the global word line may generate a third voltage at an input of the level shifter, the second state of the global word line may generate a fourth voltage at the input of the level shifter, and the first and second voltages may have opposite polarities.

15 Claims, 8 Drawing Sheets

US 7,724,582 B2

DECODERS AND DECODING METHODS FOR NONVOLATILE MEMORY DEVICES USING LEVEL SHIFTING

CROSS REFERENCE TO RELATED APPLICATIONS

This application claims priority under 35 U.S.C. §119 from Korean Patent Application 10-2006-0107554, filed on Nov. 2, 2006, the disclosure of which are hereby incorporated by reference herein in its entirety.

FIELD OF THE INVENTION

The present invention relates to nonvolatile memory devices and, more particularly, to decoders for nonvolatile memory devices.

BACKGROUND OF THE INVENTION

Flash memory devices typically are electrically erasable and/or programmable and are often used for data storage in relatively large units. Flash memory is widely used, for example, for storing a basic input/output system (BIOS) in place of a hard disk, for storing a communication protocol in a mobile phone, as an image memory in a digital camera, and other storage application.

NOR-type flash memory devices typically have a significantly greater programming and read speed in comparison to other types of nonvolatile memory devices. A typical NOR-type flash memory device includes memory cells positioned at respective intersections of word lines and bit lines. Each memory cell typically includes a control gate and a floating gate positioned between a source region and a drain region. The control gates typically are coupled to word lines, the drain regions are typically coupled in common to a bit line, and the source region is typically grounded. The floating gate typically is disposed between a channel region and the control gate.

FIG. 1 is a block diagram schematically illustrating a conventional NOR-type flash memory device. Memory blocks BLK, 10, 12, 14 and 16 and a sense amplifier S/A, 20 are illustrated. For example, the memory block 10 may have 512K memory cells, the number of word lines WL may be 1024 and the number of bit lines BL may be 512. The word lines are connected to row decoders X-DEC, 30 and 31, and the bit lines are selectively connected to the sense amplifier 20 through a column pass circuit Y-PASS 40 in response to a column decoded signal output from a column decoder. A row decoder may select one word line and a column decoder may select one bit line. The sense amplifier 20 senses whether a selected cell is an "off" cell or "on" cell, amplifying a bit line voltage according to a state of a memory cell connected to a selected word line and selected bit line.

FIG. 2 is a circuit diagram illustrating a memory cell of a memory block of the memory device of FIG. 1. A memory cell includes a cell transistor CTR1. The cell transistor CTR1 includes a control gate and a floating gate. The control gate is connected to a word line WL. A drain of the cell transistor CTR1 is connected to a bit line BL and a source is connected to a ground terminal through a source line SL.

FIG. 3 is a circuit diagram illustrating a conventional read operation of a NOR-type flash memory device as illustrated in FIGS. 1 and 2. When a cell transistor CTR10 is selected, a word line S_WL and a bit line S_BL connected to the cell transistor CTR10 are selected. Other word lines US_WL connected to other cell transistors CTR12-15 in other rows of cell transistors are unselected, and a bit line US-BL connected to cell transistors CTR11, CTR13, CTR15 is unselected. The selected bit line S_BL is selected by coupling it to the sense amplifier S/A using a column pass transistor SW1 in response to a column selection signal yi. The unselected bit line US-BL is disconnected from the sense amplifier S/A by turning off a column pass transistor SW2 in response to another column selection signal yj.

In a read operation, when a voltage, e.g., 5V, is applied to the selected word line S_WL, and 0V is applied to the unselected word lines US_WL, and the selected cell transistor CTR10 connected to the selected word line S_WL and the selected bit line S_BL is an "off" cell, cell current Icell may be approximately 0, which causes the voltage of the selected word line S_BL, which is precharged, to remain at a logic "high" value. If the selected cell transistor CTR10 is an "on" cell, cell current Icell has a larger value which, after passage of a certain amount of time, causes the voltage of the selected bit line S_BL to approach a logic "low." To read a state of the selected cell, the sense amplifier S/A is turned on at an appropriate time point in response to the column selection signal yi and performs a sense and amplification operation.

FIG. 4 is a circuit diagram illustrating a conventional program operation of a NOR-type flash memory device. To program a selected cell transistor CTR20 connected to a word line S_WL and a bit line S_BL to an "off" condition, a program voltage, for example, 10V, is applied to the selected word line S_WL. A bias voltage, for example, 5V, is applied to the selected bit line S_BL, while unselected word lines US_WL connected to unselected cell transistors CTR21, CTR22, a source line SL, and unselected bit lines (not shown) are grounded. This bias condition supports a program scheme using a channel hot electron (CHE) injection, in which a threshold voltage of cell transistor is increased by injecting hot electrons into a floating gate of the selected cell CTR20. The programmed flash memory cell CTR20 prevents current flow from a drain region thereof to a source region thereof.

FIG. 5 is a circuit diagram illustrating a conventional erase operation for a NOR-type flash memory device. To erase a memory cell transistor CTR51, a bit line BL and a source line SL are floated. A negative voltage, for example, −8V, is applied to a word line WL. A bulk voltage Vbulk, for example, 8V, is applied to a substrate of the cell transistor CTR51. The word line voltage and substrate (bulk) voltage are examples, and other voltage levels may be used. Electrons in the floating gate move via Fowler-Nordheim (FN) tunneling through a tunnel oxide layer to the semiconductor substrate. The tunneling may be induced by forming a relatively high electric field between the floating gate of the memory cell CTR51 and the semiconductor substrate.

FIG. 6 is a circuit diagram of a conventional decoder used to select word lines in the memory device shown in FIG. 1. The decoder selects one of a plurality of local word lines WL<0>-WL<7> (connected to respective pluralities of cells) in response to a combination of signals applied to a read global word line GWL_RD or a write global word line GWL_WT and corresponding one of a plurality of a partial word lines PWL<0>-PWL<7>. For example, to select a local word line WL<0> for a read operation, a read global word line GWL_RD is driven to a "high" level to turn on an NMOS transistor NM61. A current driving capability of PMOS transistors PM61 and PM62 is lower than that of the NMOS transistor NM61, so a node N60 is driven to the voltage of a line nSS_RD, which has a voltage of approximate 0V in a read operation.

When a partial word line PWL<0> is selected, a local word line WL<0> takes on a voltage supplied to the partial word line PWL<0>. For example, the partial word line PWL<0> may driven to approximately 5V, while other partial word lines PWL<1>-PWL<7> are maintained at approximately 0V. Complementary partial word lines nPWL<0>~nPWL<7> corresponding to the partial word lines PWL<0>-PWL<7> have logic levels opposite to the partial word lines PWL<0>-PWL<7>. For example, when the partial word line PWL<0> is at approximately 5V, a complementary partial word line nPWL<0> has a low level, e.g., approximately 0V, which turns off NMOS transistor NM64. The partial word lines PWL<1>-PWL<7> are at approximately 0V and the complementary partial word lines nPWL<1>-nPWL<7> have a high level, e.g., VCC level, which turns on corresponding NMOS transistors NM65.

An external voltage Vex is provided to unselected local word lines. The external voltage Vex may be a ground voltage VSS. For example, when the read global word line GWL_RD or the write global word line GWL_WT is unselected, the node N60 has a Vpx level, and NMOS transistors NM63, NM65 of the local word line drivers 60-67 are turned on. Approximately 0V is applied to partial word lines PWL<0>-PWL<7>, and complementary partial word lines nPWL<0>-nPWL<7> have a complementary voltage, e.g., VCC, which turns on NMOS transistors NM64 and NM66. Thus, local word lines WL<0>-WL<7> take on the external voltage Vex, which may be a ground voltage of around 0V. The NMOS transistors NM64 and NM66 and complementary partial word lines nPWL<0>~nPWL<7>, which can prevent floating of unselected local word line in the decoder, may complicate the structure of the decoder and unduly increase its size.

SUMMARY OF THE INVENTION

In some embodiments of the present invention, a decoder for a nonvolatile memory device includes a level shifter configured to produce a first voltage at an output thereof responsive to a first state of a global word line and to produce a second voltage at the output responsive to a second state of the global word line. The decoder further includes a plurality of local word line drivers, each having an input coupled to the output of the level shifter, the respective local word line drivers configured to drive respective local word lines responsive to voltages on respective partial word lines when the output of the level shifter is at the first voltage and to drive the respective local word lines to a common voltage when the output of the level shifter is at the second voltage. In some embodiments, the first state of the global word line generates a third voltage at an input of the level shifter, the second state of the global word line generates a fourth voltage at the input of the level shifter, and the first and second voltages have opposite polarities. The first state of the global word line may correspond to selection of the global word line and the second state of the global word line may correspond to unselection of the global word line. The first voltage may be negative and the second voltage may be positive.

In further embodiments, each local word line driver includes a PMOS transistor having a source coupled to the corresponding partial word line, a drain coupled to the corresponding local word line and a gate coupled to the output of the level shifter and an NMOS transistor having a source coupled to the corresponding local word line, a drain coupled to a node having the common voltage and a gate coupled to the output of the level shifter. The node having the common voltage may be a ground node.

In still further embodiments, the level shifter includes an input node precharge circuit configured to precharge the input of the level shifter to a third voltage when the global word line is unselected and to allow the input of the level shifter to be driven to a fourth voltage when the global word line is selected. The level shifter further includes a voltage shift circuit coupled to the input of the level shifter and configured to map the third and fourth voltages at the input of the level shift to the first and second voltages at the output of the level shifter. The input node precharge circuit may include PMOS transistors configured as a resistor and coupled between a power supply node and the input node of the level shifter and an inverter having an input coupled to the input of the level shifter and an output coupled to a first input of the voltage shift circuit. The voltage shift circuit may include a second input coupled to the input of the level shifter.

In additional embodiments, the voltage shift circuit may include: a first PMOS transistor having a gate connected to the input terminal of the level shifter and a source connected to a positive power supply node; a second PMOS transistor having a gate connected to the output of the inverter and a source connected to the positive power supply node; a first NMOS transistor having a gate connected to the drain of the second PMOS transistor, a drain connected to the drain of the first PMOS transistor, and a source connected to a node having the first voltage; a second NMOS transistor having a gate connected to the drain of the first NMOS transistor, a drain connected to the drain of the second PMOS transistor, and a source is connected to the node having the first voltage; a third PMOS transistor having a gate connected to the output of the level shifter and a source connected to the node having the second voltage; a fourth PMOS transistor having a gate connected to the drain of the third PMOS transistor and a source connected to the node having the second voltage; a third NMOS transistor having a gate connected to the drain of the second NMOS transistor, a drain connected to the gate of the fourth PMOS transistor, and a source connected to the node having the first voltage; and a fourth NMOS transistor having a gate connected to the drain of the first NMOS transistor, a drain connected to the output of the level shifter, and a source connected to the node having the first voltage.

In still further embodiments, each local word line driver may include a PMOS transistor having a gate connected to the output of the level shifter, a source connected to the corresponding partial word line, and a drain connected to the corresponding local word line, and an NMOS transistor having a gate connected to the output of the level shifter, a drain connected to the drain of the PMOS transistor, and a source couple to a node having the common voltage.

Further embodiments provide a local word line driver for a nonvolatile memory device, the word line driver including a global word line input, a PMOS transistor having a source coupled to partial word line, a drain coupled to a local word line and a gate coupled to the global word line input. The local word line driver further includes an NMOS transistor having a drain coupled to the local word line, a source coupled to a fixed voltage node and a gate coupled to the global word line input. The local word line is driven responsive to the partial word line when the global word line input has a first voltage and is unresponsive to the partial word line when the global word line input has a second voltage. For example, the NMOS transistor may drive the local word line to a float prevention voltage, e.g., a ground voltage, when the global word line input has the second state.

Additional embodiments of the present invention provide methods of operating a memory device. First and second voltages of opposite polarities are generated on a global word line output node responsive to respective first and second states of a global word line. Respective local word lines are driven responsive to voltages on respective partial word lines when the global word line output node is at the first voltage. The local word lines are driven to a common voltage when the global word line output node is at the second voltage. Generating first and second voltages of opposite polarities on a global word line output node responsive to respective first and second states of a global word line may include generating third and fourth voltages having the same polarity responsive to respective ones of the first and second states of the global word line, and level shifting the third and fourth voltages to produce the respective first and second voltages on the global word line output node.

Some embodiments of the invention provide decoders, local word line driver and methods that may have reduced complexity and size. In some embodiments, a decoder may be simplified by reducing NMOS transistors added in the decoder to prevent an unselected local word line from floating and by reducing signal lines to control each of the NMOS transistors, which can also allow an area of the decoder to be reduced.

DETAILED DESCRIPTION

Figure 1:
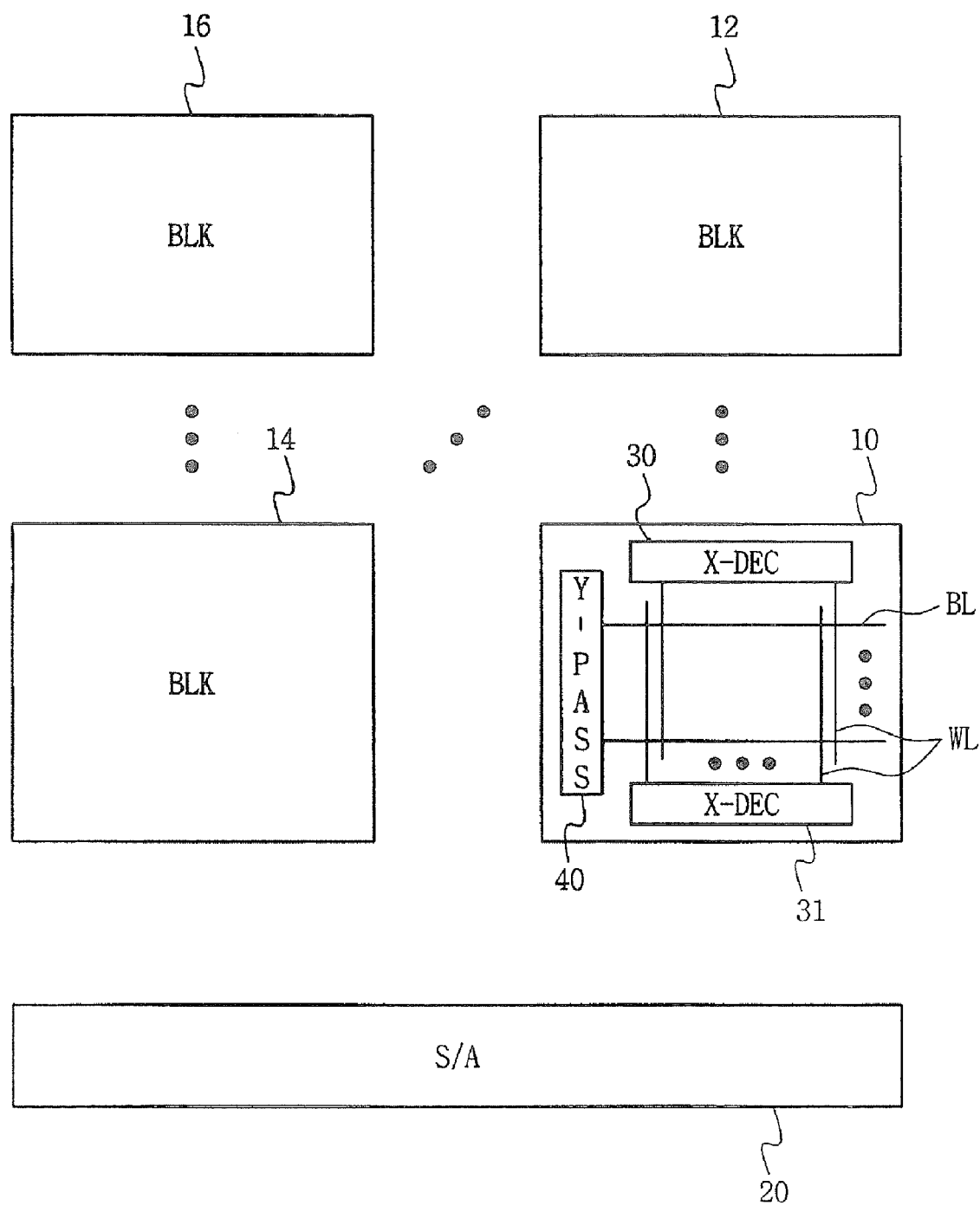
FIG. 1 is a schematic block diagram illustrating a conventional NOR-type flash memory device.
Figure 2:
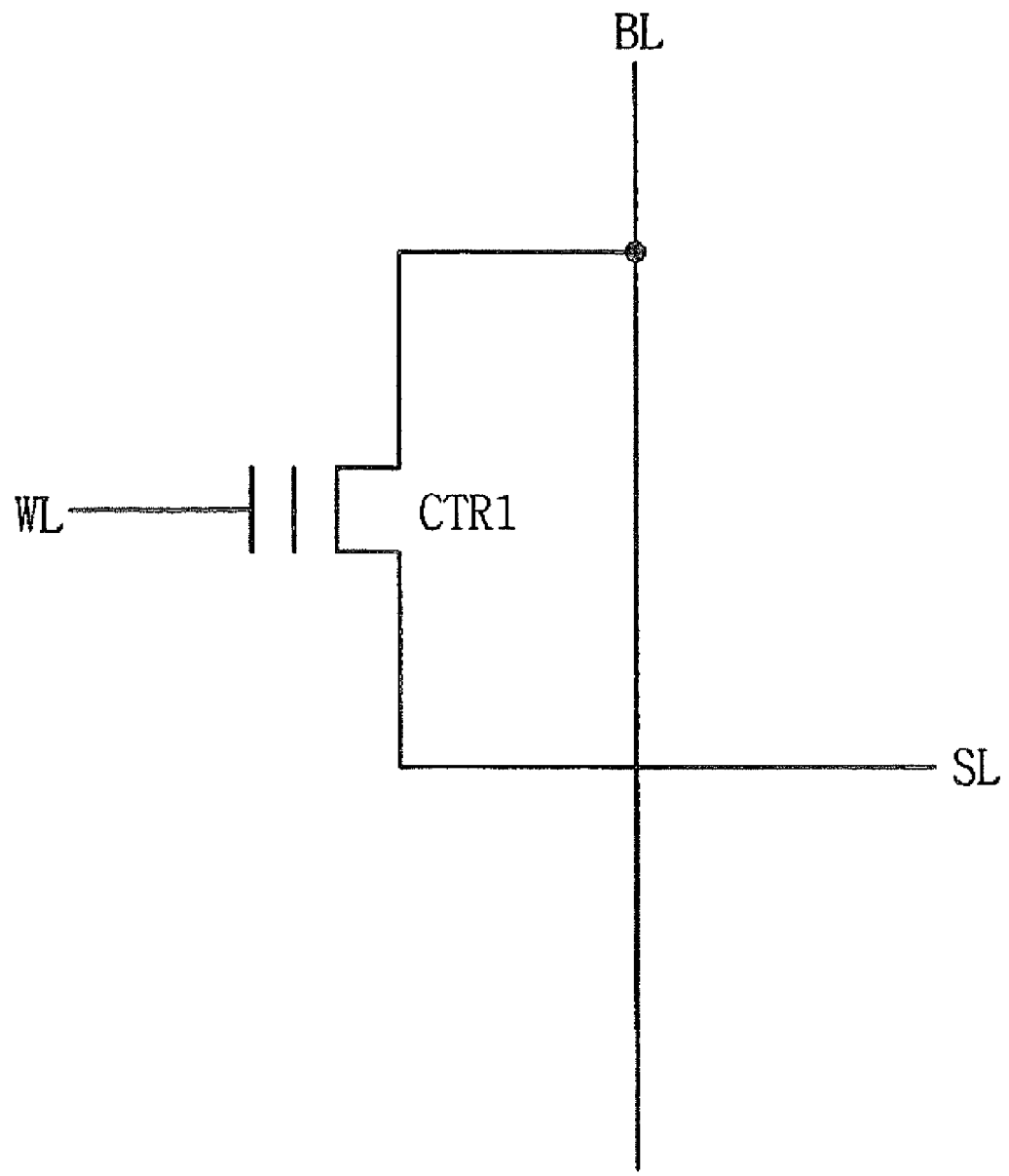
FIG. 2 is a circuit diagram illustrating one memory cell in a memory block of the memory device of FIG. 1.
Figure 3:
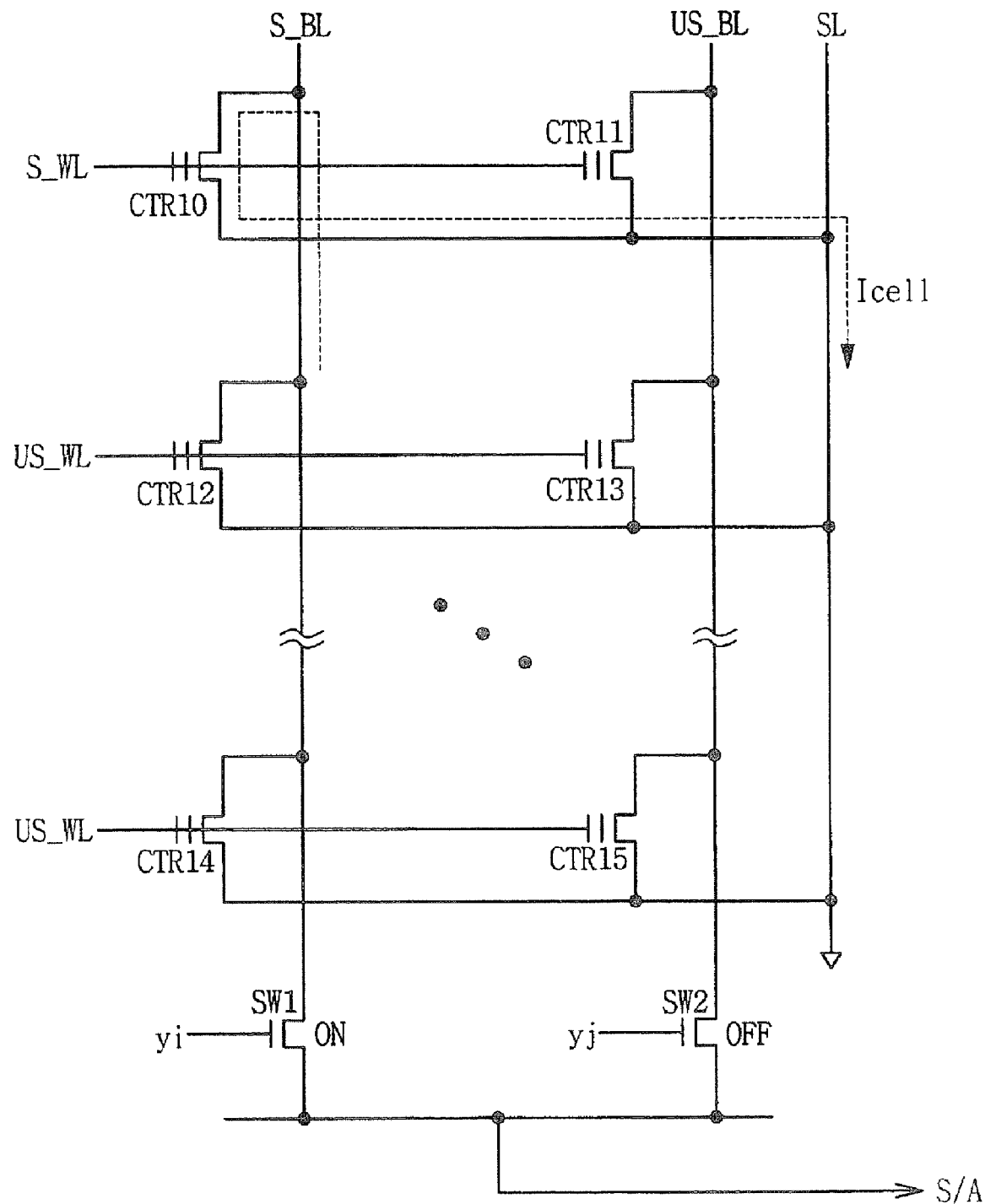
FIG. 3 is a circuit diagram illustrating a read operation of the NOR-type flash memory device of FIG. 1.
Figure 4:
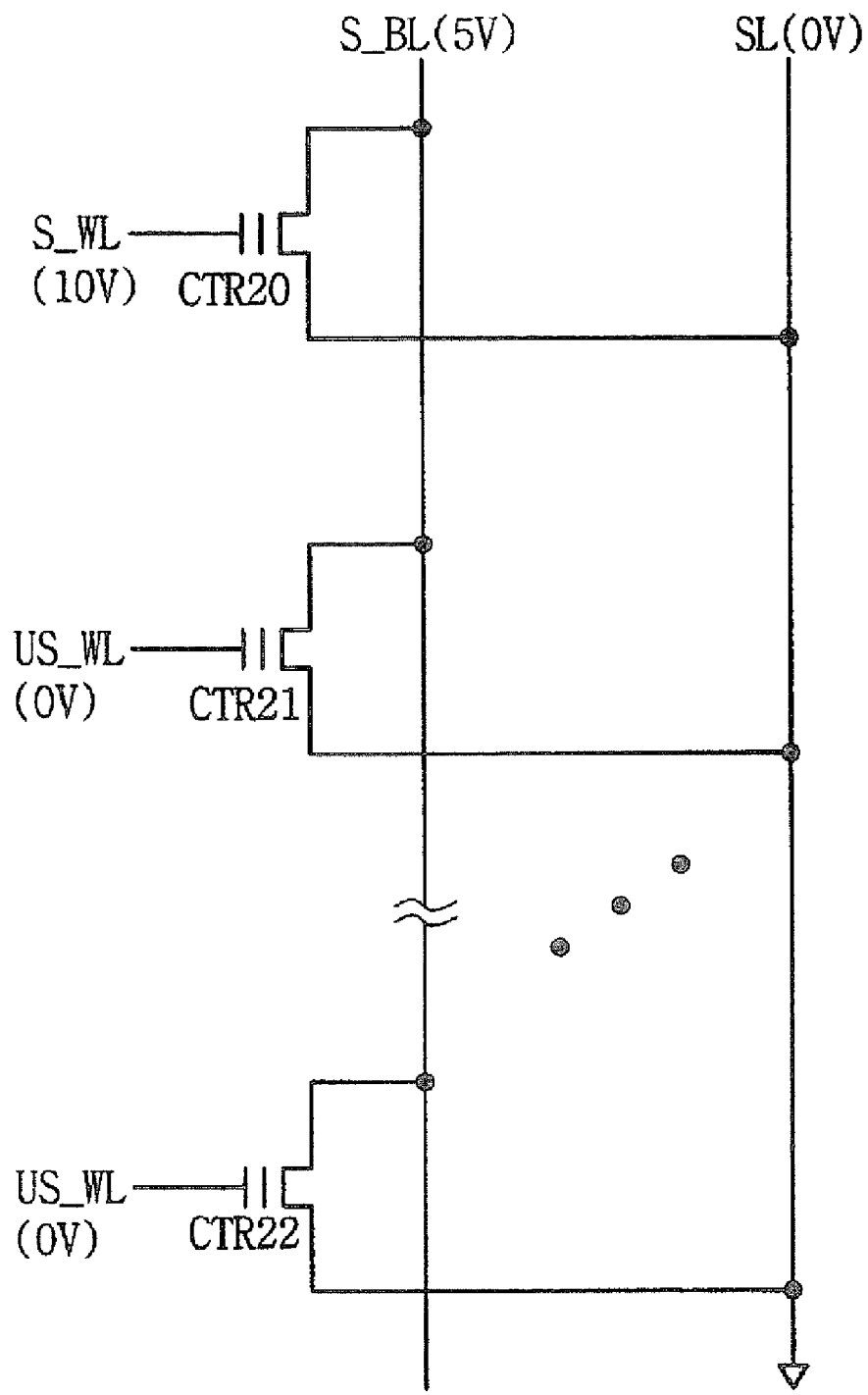
FIG. 4 is a circuit diagram illustrating a write operation of the NOR-type flash memory device of FIG. 1.
Figure 5:
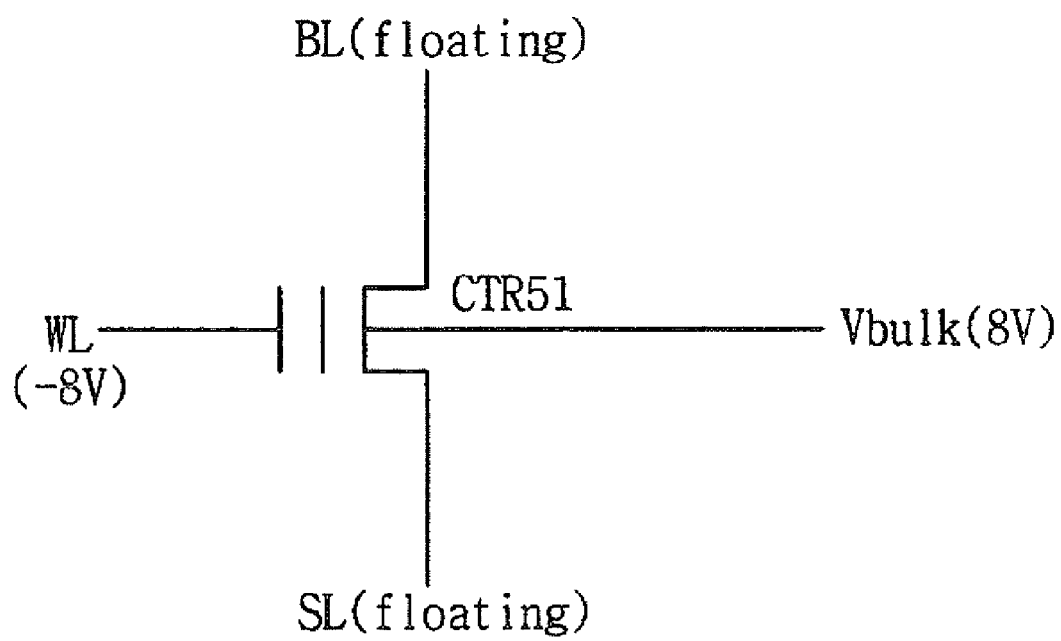
FIG. 5 is a circuit diagram illustrating an erase operation of the NOR-type flash memory device of FIG. 1.
Figure 6:
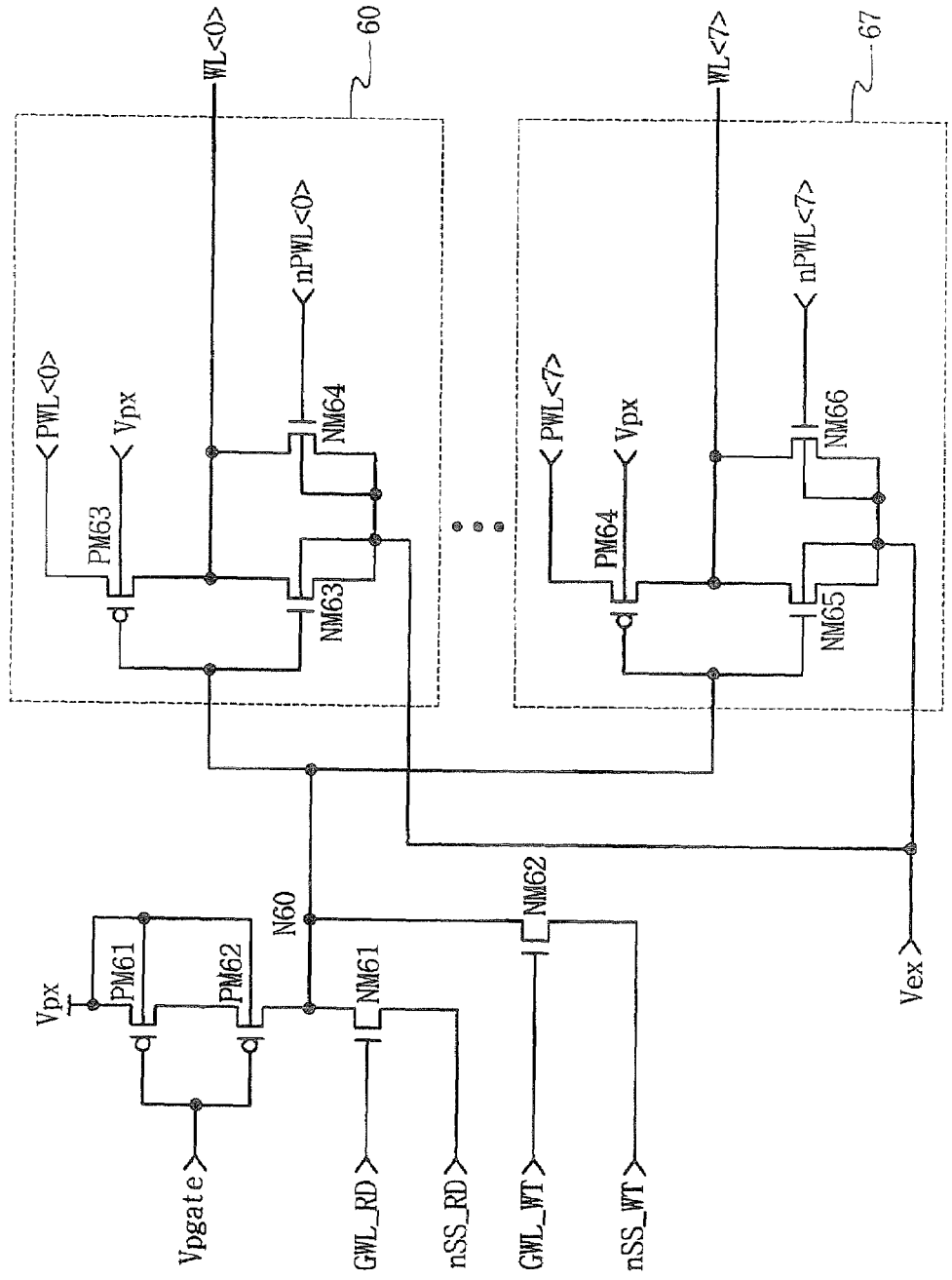
FIG. 6 is a circuit diagram of illustrating a word line decoder for the memory device of FIG. 1.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the sizes or configurations of elements may be idealized or exaggerated for clarity. It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Figure 7:
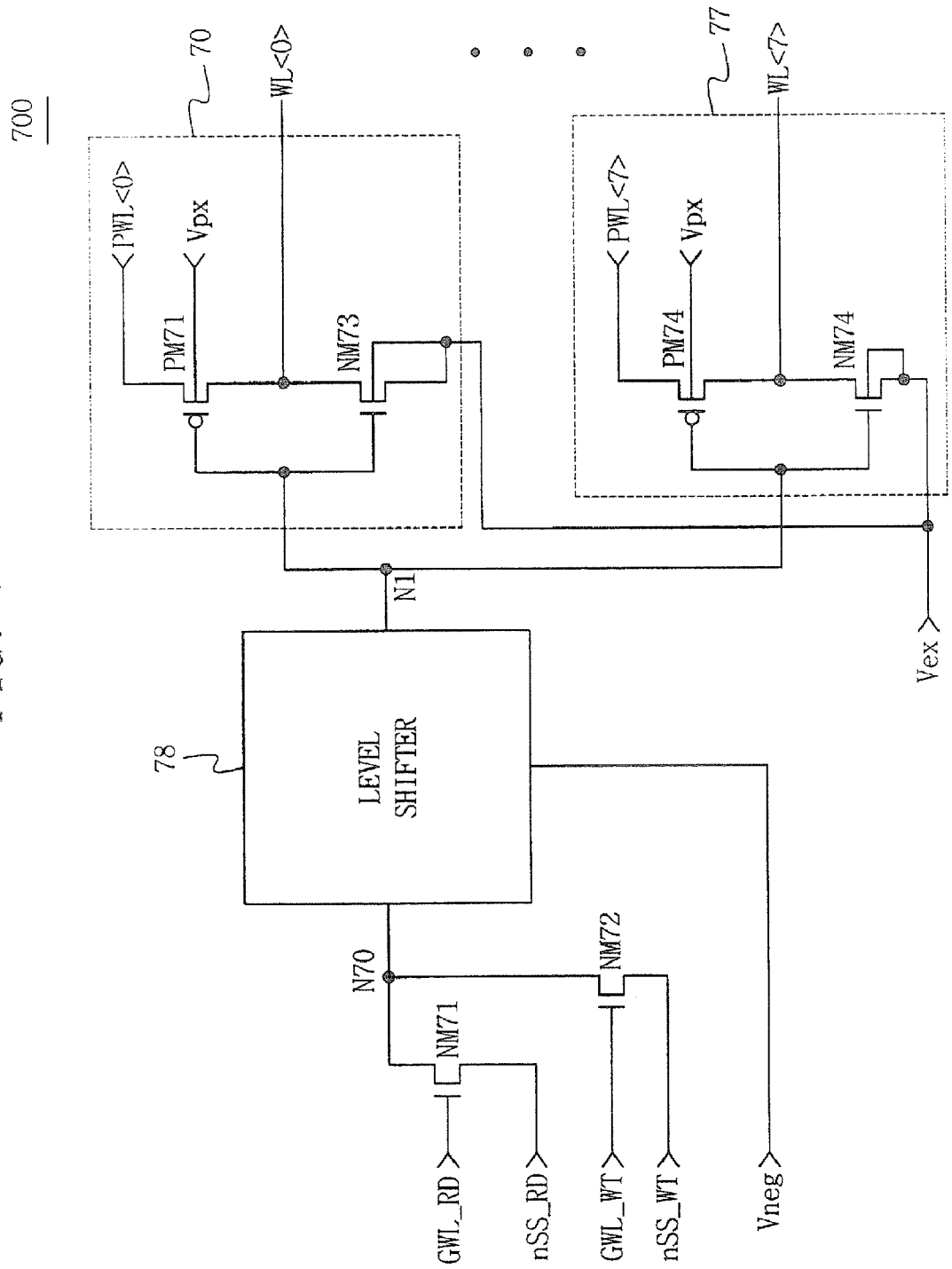
FIG. 7 illustrates a decoder of a nonvolatile memory device according to some embodiments of the invention.

FIG. 7 illustrates a decoder 700 of a nonvolatile memory device according to some embodiments of the invention. The nonvolatile memory device includes local word lines WL<0>-WL<7> connected to respective memory cells of the memory device. The local word lines WL<0>-WL<7> are driven responsive to a read global word line GWL_RD and a write global word line GWL_WT, which may be selected by NMOS transistors NM71, NM72. The decoder 700 selects local word lines WL<0>-WL<7> in response to signals applied on the read global word line GWL_RD, the write global word line GWL_WT and a partial word lines PWL<0>-PWL<7>.

The decoder 700 includes a level shifter 78 and local word line drivers 70-77. The level shifter 78 provides a positive voltage, e.g., VCC, to a first node N1 when the read global word line GWL_RD and the write global word line GWL_WT are unselected. When the read global word line GWL_RD or the write global word line GWL_WT is selected, the level shifter 78 provides a negative voltage Vneg to the first node N1.

Figure 8:
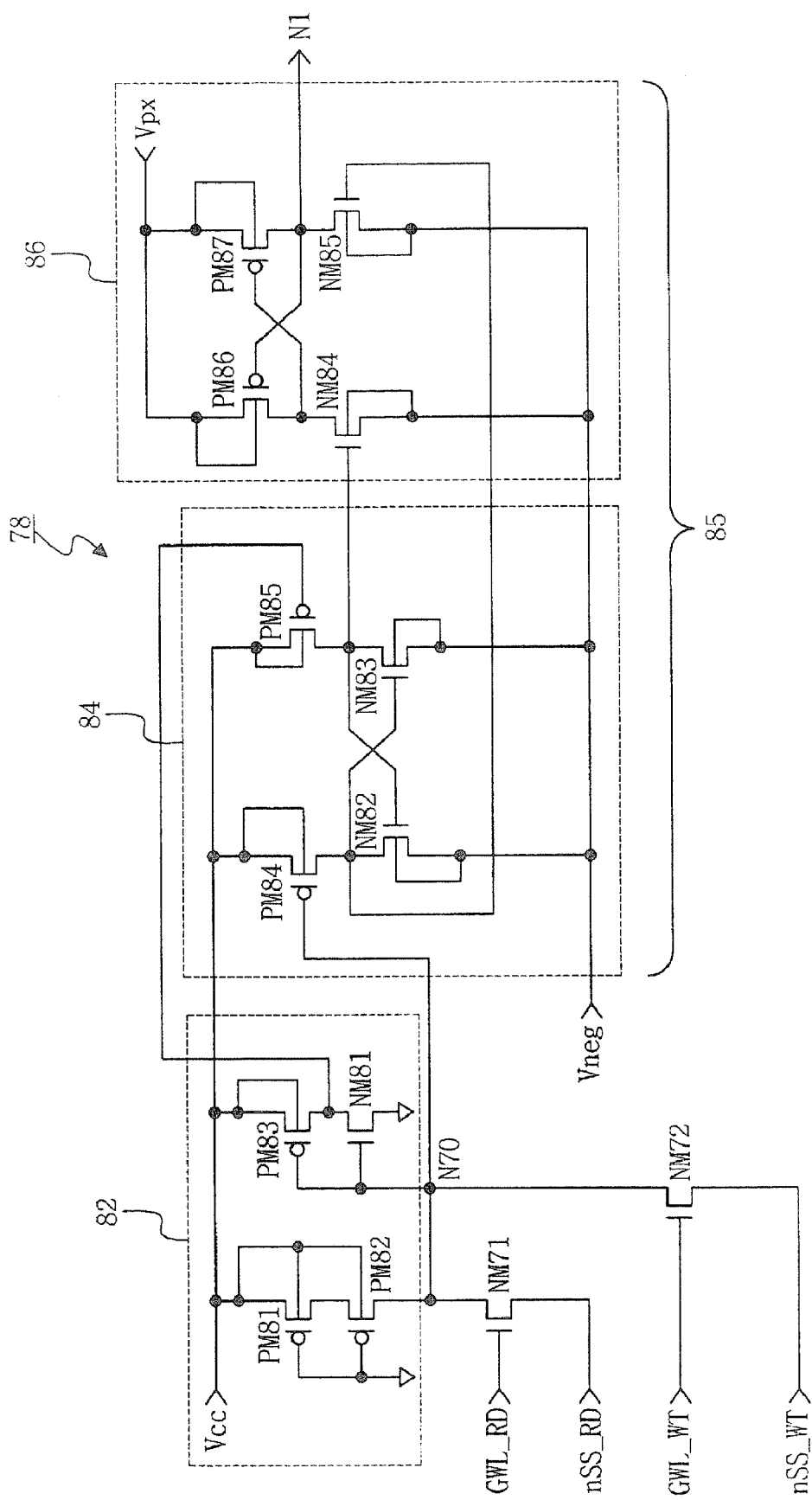
FIG. 8 is a circuit diagram illustrating a level shifter for the decoder of FIG. 7 according to further embodiments of the present invention.

The level shifter 78 is shown in FIG. 8. The level shifter 78 includes an input node precharge circuit 82 and a voltage shifting circuit 85 including negative voltage supply circuits 84 and 86. The input node precharge circuit 82 includes a pair of serially connected PMOS transistors PM81, PM82 and an inverter including a PMOS transistor PM 83 and an NMOS transistor NM81. The input node precharge circuit 82 precharges an input terminal N70 of the level shifter 78 when a connected read global word line GWL_RD or a write global word line GWL_WT is unselected. When the connected read global word line GWL_RD or write global word line GWL_WT is unselected, a voltage VCC is provided to the input terminal N70 of the level shifter 78 through PMOS transistors PM81, PM82 having gates biased to a ground voltage.

A current driving capability of the NMOS transistors NM71, NM72 is much greater than that of PMOS transistor PM81, PM82. Thus, when the connected read global word line GWL_RD or write global word line WL_WT is selected, the corresponding NMOS transistor NM71, NM72 is turned on, and the input terminal N70 of the level shifter is driven to the voltage of the corresponding line nSS_RD or nSS_WT.

The lines nSS_RD and nSS_WT each have a ground voltage of around 0V in read and program operations.

The negative voltage supply circuits 84, 86 provide a negative voltage Vneg to the first node N1 when the connected global word line real line GWL_RD or write global word line GWL_WT is selected. The negative voltage supply circuits 84, 86 may be realized in various forms, and the circuits shown in FIG. 8 are examples. The negative voltage supply circuits 84, 86 includes first, second, third and fourth PMOS transistors PM84, PM85, PM86 and PM87, and first, second, third and fourth NMOS transistors NM82, NM83, NM84 and NM85.

For the first PMOS transistor PM84, a gate is connected to an input terminal of the level shifter, a source is connected to a power source voltage terminal VCC, and a drain is connected to a drain of the first NMOS transistor NM82. For the second PMOS transistor PM85, a gate is connected to an output terminal of the inverter composed of the transistors PM83, NM81, a source is connected to the power source voltage terminal VCC, and a drain is connected to a drain of the second NMOS transistor NM83. For the third PMOS transistor PM86, a gate is connected to an output terminal N1 of the level shifter 78, a source is connected to a default voltage supply terminal, and a drain is connected to a drain of a third NMOS transistor. For the fourth PMOS transistor PM87, a gate is connected to a drain of the third PMOS transistor PM86, a source is connected to the default voltage supply terminal, and a drain is connected to the gate of the third PMOS transistor PM86.

For the first NMOS transistor NM82, a gate is connected to the drain of the second PMOS transistor PM85, a drain is connected to the drain of the first PMOS transistor PM84, and a source is connected to a negative voltage supply terminal Vneg. For the second NMOS transistor NM83, a gate is connected to the drain of the first NMOS transistor NM82, a drain is connected to the drain of the second PMOS transistor PM85, and a source is connected to the negative voltage supply terminal Vneg. For the third NMOS transistor NM84, a gate is connected to the drain of the second NMOS transistor NM83, a drain is connected to the gate of the fourth PMOS transistor PM87, and a source is connected to the negative voltage supply terminal Vneg. For the fourth NMOS transistor NM85, a gate is connected to the drain of the first NMOS transistor NM82, a drain is connected to an output terminal of the level shifter 78, and a source is connected to the negative voltage supply terminal Vneg.

When node N70 has a low level of around 0V, the first PMOS transistor PM84 is turned on, and the fourth NMOS transistor NM85 is turned on, causing the first node N1 to have the negative voltage Vneg. When the node N70 has precharge voltage VCC, the first node N1 has a default voltage Vpx.

Referring again to FIG. 7, a local word line driver 70 includes a PMOS transistor PM71 and a NMOS transistor NM73. A gate of the PMOS transistor PM71 is connected to the first node N1, while its source is connected to a partial word line PWL<0> and its drain is connected to a drain of the NMOS transistor NM73. A gate of the NMOS transistor NM73 is connected to the first node N1, while its drain is connected to a drain of the PMOS transistor PM71. Its source is tied to an external voltage line Vex.

When read global word line GWL_RD is selected and local word line WL<0> is selected, the first node N1 has negative voltage Vneg. An operating voltage is provided to the local word line WL<0> through partial word line PWL<0>. The operating voltage may be, for example, 5V in a read operation or 10V in a program operation. Even though the first node N1 has the negative voltage Vneg, the rest of the local word lines WL<1>-WL<7> are unselected. A voltage is provided to the unselected local word lines WL<1>-WL<7> through corresponding partial word line PWL<1>-PWL<7>. This voltage may be, for example, a ground voltage of around 0V in both read and program operations.

When the first node N1 has a default voltage Vpx, the external voltage Vex is provided to the local word line. The external voltage Vex may be a ground voltage VSS. When the voltage of output terminal N1 of the level shifter 78 is the negative voltage Vneg, the local word line driver provides an operating voltage to the selected local word line, e.g., WL<0>, through a corresponding partial word line PWL<0>, and provides a ground voltage VSS to unselected local word lines WL<1>-WL<7> through corresponding partial word lines PWL<1>-PWL<7>. When the output terminal N1 of the level shifter 78 has the default voltage Vpx, the local word line driver provides a floating prevention voltage to unselected local word lines WL<0>~WL<7>. The floating prevention voltage may be lower than the default voltage, for example, a ground voltage VSS.

As shown in FIG. 7, a local word line driver 70 includes one PMOS transistor PM71 and one NMOS transistor NM73. The PMOS transistor PM71 is turned on by the negative voltage Vneg of input terminal N1, to provide an operating voltage to the local word line WL<0> when it is selected. The operating voltage is provided through a corresponding partial word line PWL<0>.

The NMOS transistor NM73 provides a floating prevention voltage Vex to the local word line local word line WL<0> when it is not selected. The floating prevention voltage Vex is provided to the local word line WL<0> through the NMOS transistor NM73 turned on by the default voltage Vpx of the input terminal N1.

It is desirable that the negative voltage Vneg be sufficient to turn on a PMOS transistor PM74 of a local word line driver 77 connected to an unselected local word line WL<7>. For example, when a voltage applied to partial word line PWL<7> connected to the unselected local word line WL<7> is around 0V, the negative voltage Vneg may be −2V.

Thus, in a decoder of a nonvolatile memory device according to some embodiments of the invention, problems that may be caused by control signals and circuits added to prevent a floating of an unselected local word line in a decoder of a conventional nonvolatile memory device may be reduced. In particular, the structure of the decoder can be simplified and an area occupied by the decoder can be reduced, by reducing the number of NMOS transistors and signal lines to control each of the NMOS transistors added in a decoder of a conventional nonvolatile memory device to prevent a floating of unselected local word line.

Operations of a decoder in a nonvolatile memory device according to some embodiments of the invention will be described with reference to FIGS. 7 and 8. According to some embodiments of the invention, in a decoder of a nonvolatile memory device for selecting one local word line WL through a combination of signals applied to a partial word line PWL and a read global word line GWL_RD and a write global word line GWL_WT in accessing to a memory cell, decoding operations include providing negative voltage Vneg to input terminals of a plurality of local word line drivers 70-77 corresponding to a selected global word line when the read global word line GWL_RD or a write global word line GWL_WT is selected, and providing an operating voltage thereto through a partial word line, e.g., PWL<0>, to select a local word line WL<0>. A ground voltage VSS is provided in common to unselected local word lines WL<1>~WL<7> through corresponding partial word lines PWL<1>~PWL<7>. Local word lines corresponding to a global word line other than the selected read global word line GWL_RD or write global word line GWL_WT have a ground voltage through use of an NMOS transistor NM73-NM74 in each of the local word line drivers 70-77, under an assumption that the read global word line GWL_RD or write global word line GWL_WT shown in FIG. 7 is unselected. The negative voltage Vneg may have a level sufficient to turn on a PMOS transistor PM74 in the local word line driver 77 coupled to the unselected local word line.

Therefore, according to some embodiments of the invention, problems caused by control signals and circuits added to prevent a floating of unselected local word line in a decoder of a conventional nonvolatile memory device may be reduced. In particular, the structure of a decoder can be simplified by reducing NMOS transistors added in the decoder to prevent a floating of unselected local word line and by reducing signal lines to control each of the NMOS transistors. The area of the decoder can also be reduced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A decoder for a nonvolatile memory device, the decoder comprising:
   a level shifter configured to produce a first voltage at an output thereof responsive to a first state of a global word line and to produce a second voltage at the output responsive to a second state of the global word line; and
   a plurality of local word line drivers, each having an input coupled to the output of the level shifter, the respective local word line drivers configured to drive respective local word lines responsive to voltages on respective partial word lines when the output of the level shifter is at the first voltage and to drive the respective local word lines to a common voltage when the output of the level shifter is at the second voltage.

2. The decoder of claim 1, wherein the first state of the global word line generates a third voltage at an input of the level shifter, wherein the second state of the global word line generates a fourth voltage at the input of the level shifter, wherein the third and fourth voltages have the same polarity and wherein the first and second voltages have opposite polarities.

3. The decoder of claim 2, wherein the first state of the global word line corresponds to selection of the global word line and wherein the second state of the global word line corresponds to unselection of the global word line.

4. The decoder of claim 2, wherein the first voltage is negative and the second voltage is positive.

5. The decoder of claim 1, wherein each local word line driver comprises:

a PMOS transistor having a source coupled to the corresponding partial word line, a drain coupled to the corresponding local word line and a gate coupled to the output of the level shifter; and
an NMOS transistor having a source coupled to the corresponding local word line, a drain coupled to a node having the common voltage and a gate coupled to the output of the level shifter.

6. The decoder of claim 5, wherein the node having the common voltage comprises a ground node.

7. The decoder of claim 1, wherein the level shifter comprises:
   an input node precharge circuit configured to precharge the input of the level shifter to a third voltage when the global word line is unselected and to allow the input of the level shifter to be driven to a fourth voltage when the global word line is selected; and
   a voltage shift circuit coupled to the input of the level shifter and configured to map the third and fourth voltages at the input of the level shift to the first and second voltages at the output of the level shifter.

8. The decoder of claim 7:
   wherein the input node precharge circuit comprises:
      a PMOS transistor configured as a resistor and coupled between a power supply node an the input node of the level shifter; and
      an inverter having an input coupled to the input of the level shifter and an output coupled to a first input of the voltage shift circuit; and
   wherein the voltage shift circuit has a second input coupled to the input of the level shifter.

9. The decoder of claim 8, wherein the voltage shift circuit comprises:
   a first PMOS transistor having a gate connected to the input terminal of the level shifter and a source connected to a positive power supply node;
   a second PMOS transistor having a gate connected to the output of the inverter and a source connected to the positive power supply node;
   a first NMOS transistor having a gate connected to the drain of the second PMOS transistor, a drain connected to the drain of the first PMOS transistor, and a source connected to a node having the first voltage;
   a second NMOS transistor having a gate connected to the drain of the first NMOS transistor, a drain connected to the drain of the second PMOS transistor, and a source is connected to the node having the first voltage;
   a third PMOS transistor having a gate connected to the output of the level shifter and a source connected to the node having the second voltage;
   a fourth PMOS transistor having a gate connected to the drain of the third PMOS transistor and a source connected to the node having the second voltage;
   a third NMOS transistor having a gate connected to the drain of the second NMOS transistor, a drain connected to the gate of the fourth PMOS transistor, and a source connected to the node having the first voltage; and
   a fourth NMOS transistor having a gate connected to the drain of the first NMOS transistor, a drain connected to the output of the level shifter, and a source connected to the node having the first voltage.

10. The decoder of claim 1, wherein each local word line driver comprises:
    a PMOS transistor having a gate connected to the output of the level shifter, a source connected to the corresponding partial word line, and a drain connected to the corresponding local word line; and an NMOS transistor having a gate connected to the output of the level shifter, a drain connected to the drain of the PMOS transistor, and a source coupled to a node having the common voltage.

11. The decoder of claim 1, wherein the voltages on the partial word lines comprise read or program voltages.

12. The decoder of claim 1, wherein the common voltage is less than the second voltage.

13. The decoder of claim 1, wherein the common voltage is a ground voltage.

14. A memory device comprising the decoder of claim 1.

15. A method of operating a memory device, the method comprising:

generating first and second voltages of opposite polarities on a global word line output node responsive to respective first and second states of a global word line, wherein generating first and second voltages of opposite polarities on a global word line output node responsive to respective first and second states of a global word line comprises:

generating third and fourth voltages having the same polarity responsive to respective ones of the first and second states of the global word line; and level shifting the third and fourth voltages to produce the respective first and second voltages on the global word line output node;

driving respective local word lines responsive to voltages on respective partial word lines when the global word line output node is at the first voltage; and driving all of the local word lines to a common voltage when the global word line output node is at the second voltage.

* * * * *